United States Patent [19]

Hartgring et al.

[11] Patent Number: 4,783,601
[45] Date of Patent: Nov. 8, 1988

[54] INTEGRATED LOGIC CIRCUIT HAVING A CONTROL CIRCUIT FOR GENERATING A TIME-DEPENDENT WAVEFORM

[75] Inventors: Cornelis D. Hartgring; Roelof H. W. Salters; Cormac M. O'Connell; Joannes J. M. Koomen, all of Eindhoven, Netherlands

[73] Assignee: U.S. Philips Corporation, New York, N.Y.

[21] Appl. No.: 9,428

[22] Filed: Feb. 2, 1987

[30] Foreign Application Priority Data

Jun. 17, 1986 [NL] Netherlands .................. 8601558

[51] Int. Cl.$^4$ .................. H03K 17/56; H03K 3/01; H03K 17/681; H03K 5/13
[52] U.S. Cl. .................. 307/246; 307/270; 307/448; 307/571; 307/597
[58] Field of Search .................. 307/246, 270, 571, 448, 307/597, 603, 490; 328/66, 67, 144

[56] References Cited

FOREIGN PATENT DOCUMENTS 1208601  1/1986  U.S.S.R. .................. 307/571

OTHER PUBLICATIONS

Evans, "Designing with FET's", 1981, pp. 79–81.
Stoops, "Circuit to Control the Time Rate of Change of Current at the Output Node of an Off-Chip Driver", IBM Technical Disclosure Bulletin, vol. 27, No. 1A, Jun. 1984.

Primary Examiner—Stanley D. Miller
Assistant Examiner—Trong Quang Phan
Attorney, Agent, or Firm—Steven R. Biren

[57] ABSTRACT

An integrated logic circuit includes an output circuit for generating an output current which increases linearly in time. In integrated logic circuits the problem presents itself that the rapid variation of the (dis) charging of a data output causes a reverse voltage pulse VL across the inductance formed by the connection wires. The reverse voltage is limited by causing the charge or discharge current (for the load capacities present) to increase linearly to a maximum permissible value. This is done by driving the output field effect transistor with a control voltage VC which varies in time in the form of a square root.

9 Claims, 4 Drawing Sheets

INTEGRATED LOGIC CIRCUIT HAVING A CONTROL CIRCUIT FOR GENERATING A TIME-DEPENDENT WAVEFORM

BACKGROUND OF THE INVENTION

The invention relates to an integrated logic circuit having an output circuit connected between a first and a second supply terminal with at least one data output in which the conductivity channel of an insulated gate output field effect transistor connects the said data output to one of the two supply terminals, the logic circuit comprising a control circuit for generating a time-dependent control voltage at the control electrode of the output field effect transistor.

Such a logic circuit is known from IBM's Technical Disclosure Bulletin, Vol. 27, No. 1A, June 1984, pp. 13 and 14, in which an output circuit is shown in which the control voltage at the control electrode of the output field effect transistor in the first instance increases slowly and, after switching on an extra field effect transistor, increases rapidly to make the output field effect transistor fully conductive in a short period of time.

In spite of this provision the prior art circuit arrangement suffers from the disadvantage that in particular during the rapid increase of the control voltage too high inductive reverse voltage peaks may yet be formed at the supply terminals on the integrated circuit which might seriously interfere with the correct operation of the circuit. Although the known circuit has for its object to mitigate this disadvantage, if the data output is charged with a comparatively large capacity, this will hardly be discharged when the extra field effect transistor is switched on, which causes a high reverse voltage peak across the inductance formed by the connection wires of the integrated circuit. It is possible to switch on the extra field effect transistor at a later instant but this has for its result that the output voltage becomes more inert, which is highly undesirable.

SUMMARY OF THE INVENTION

It is an object of the invention to provide an integrated logic circuit in which the value of the reverse voltage peak can be limited to a previously-chosen value and is independent of the value of the capacity connected to the data output, the output circuit charging or discharging the data output at a maximum speed.

For that purpose an integrated logic circuit according to the invention is characterized in that the control circuit, at least during an initial period after switching on same, generates a control voltage which varies approximately proportionally to the square root of time.

The invention is based on the recognition of the fact that at least during the initial period of controlling the output field effect transistor, which has to charge or discharge the data output, said output field effect transistor is saturated. This results in its main current in this initial period being independent of the voltage across the conductivity channel and approximately in a quadratic relationship with the control voltage at the control electrode. Since the value of the inductive reverse voltage peak is proportional to the variation of the current per time unit, an optimum effect is achieved by causing the control voltage at the control electrode to vary approximately root-like, at least during said initial period, so that the main current increases uniformly from an initial value and, during said increase, causes a chosen limited constant inductive reverse voltage.

"Root-like" variation of the voltage is in accordance with the $n^{th}$ root in time and for convenience of description this variation or increase will hereinafter be referred to as "root-like".

As noted hereinbefore, the control voltage for the output field effect transistor has a non-linear increase during an initial period. In the present-day conventional field effect transistors the control voltage may also increase, after the said initial period, according to the root-like curve since in said transistors, the said relationship between the main current, the voltage across the conductivity channel and the voltage at the control electrode remains when the voltage at said control electrode increases (channel length at approximately 2 $\mu$m).

In "narrow" field effect transistors, however, which are now partly under development and (will be) used (channel length 1 to 1.2 $\mu$m or smaller) the control voltage after the initial period will not have to increase "root-like" as a function of the time but more rapidly (for example $::t^{\frac{3}{4}}$ instead of $::t^{\frac{1}{2}}$) to reach the end in view: a constant increase of the current as a function of time. Dependent on the transistor geometry, the control voltage should increase according to a three-quarterth power root from time or ultimately even according to a linear function of time. Of course, the variation of the control voltage as a function of time which thus:

(a) always follows the "root-like" curve, or (b) increases "root-like" only in the initial period and then more rapidly ($\approx t^{\frac{3}{4}}$ or linearly :t) has consequences for the components for generating said control voltage. The above last case is necessary only with narrow transistors in which the electric field strength E becomes located higher than the value IV/$\mu$m.

By a correct proportioning and choice of the electric components it is now possible to limit the reverse voltage, in which it should be noted that the value of the capacity present at the data output is irrelevant. Besides, said method of "root-like" driving of the output transistor provides the fastest possible charge or discharge of the data output with a permitted (constant) reverse voltage.

In an embodiment an integrated logic circuit according to the invention is characterized in that the control circuit comprises a capacitive load which is connected between the control electrode and the supply terminals and a charge source which is connected between the control electrode and one of the two supply terminals.

The charge source may charge or discharge the capacitive load for generating the root-like control voltage. The capacitive load may consist only of the internal capacity of the control electrode of the output field effect transistor, but it is possible to add an extra capacity so that the value of the capacity load is less dependent on the manufacturing spread in producing the output field effect transistor. Additionally, the capacitive load may be proportioned so that the associated charge source can simply be realized in that it comprises only readily reproducible components.

In a further embodiment an integrated logic circuit according to the invention is characterized in that the charge source comprises a current branch with a series arrangement of the conductivity channels of a first and second insulated gate field effect transistor, the control electrode of the first and the conductivity channel of the second field effect transistor being connected to the control electrode of the output field effect transistor and the conductivity channel of the first field effect transistor being connected to one of the two supply terminals, the control electrode of the second field effect transistor being connected to an energization input for receiving an energization signal for the output field effect transistor.

After receiving the energization signal, the current branch with a small number of components provides a good approximation of the optimum current-voltage characteristic for the charge source. In the absence of the energization signal the second field effect transistor, which is in the reverse condition, prevents a further charging or discharging of the control electrode.

In a further embodiment an integrated logic circuit according to the invention is characterized in that the charge source comprises a third insulated gate field effect transistor, the control electrode of which is connected to the energization input and the conductivity channel is connected in parallel with the series arrangement of the first and the second field effect transistors.

The addition of the third field effect transistor provides a better approach of the optimum voltage-current characteristic for the charge source and has the important advantage that the control electrode of the output transistor is driven to the full supply voltage.

In another embodiment an integrated logic circuit according to the invention is characterized in that the charge source comprises several parallel-arranged current branches, which have mutually different switch-off voltages.

The use of said current branches provides the approach of the voltage-current characteristic for the charge source.

In a further embodiment an integrated logic circuit according to the invention in which the output field effect transistor is of the n-type, is characterized in that a capacitive load comprises a p-channel insulated gate field effect transistor, which field effect transistor is connected with its main electrodes to the supply terminal for receiving the higher of the two supply voltages and is connected with its control electrode to the control electrode of the output field effect transistor.

All the charge sources generate too little charge current when the control voltage reaches the level of the highest supply voltage. This effect can be masked by using the above-mentioned p-channel transistor since the conductivity channel of said transistor which is connected as a capacitor disappears as soon as the voltage difference between the supply voltage and the control voltage reaches the threshold voltage of the transistor which is connected as a capacitor and as a result of this its capacity strongly decreases. As a result of this, relatively more current becomes available for charging the control electrode of the output field effect transistor so that the decrease of the charge current generated by the charge source is compensated for. This measure may also be applied to a p-channel output field effect transistor.

BRIEF DESCRIPTION OF THE DRAWING

The invention will now be described in greater detail with reference to the following figures, in which.

Figure 1:
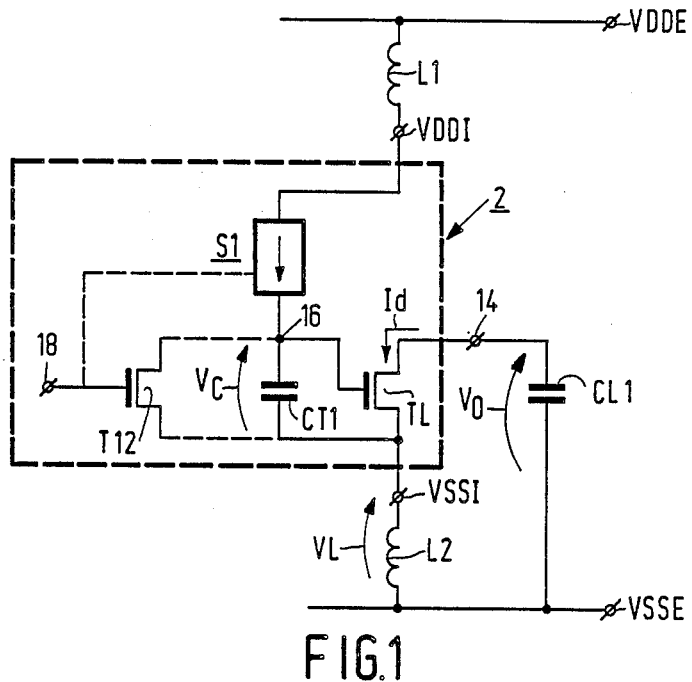
FIG. 1 shows an equivalent circuit diagram of an integrated circuit according to the invention upon discharging a data output.
Figure 3:
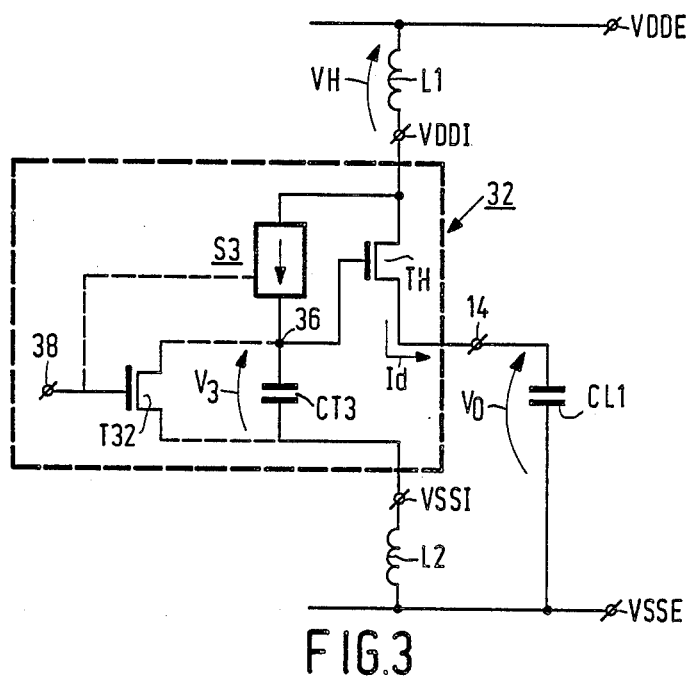
FIG. 3 shows an equivalent circuit diagram of an integrated circuit according to the invention upon charging a data output.

All the transistors shown in FIGS. 1 and 3 are of the N-conductivity type.

DESCRIPTION OF THE PREFERRED EMBODIMENTS

FIG. 1 shows an equivalent circuit diagram of an output circuit of an integrated circuit according to the invention upon discharging a data output in which only the significant components are shown. The integrated circuit 2 comprises a data output 14, and a first and a second supply terminal VDDI and VSSI which are each connected via inductive connection wires L1 and L2, respectively, to the first and second, respectively, external supply voltage VDDE and VSSE, respectively. The data output 14 is connected, via a capacitor CL1, to the second external supply voltage VSSE to symbolize the capacitive output load. The output circuit furthermore comprises an internal junction 16 which is connected, via a charge source S1, to the first supply terminal VDDI and, via a capacitor CT1, to the second supply terminal VSSI. The capacitor CT1 symbolizes the capacitive load of the control electrode of the output field effect transistor TL also connected to the junction 16, which load consists of the sum of the internal capacity of the control electrode and the capacities between the control electrode and the two supply terminals VDDI and VSSI. The conductivity channel of the output field effect transistor TL connects the data output 14 to the second supply terminal VSSI. The charge source S1 generates the control voltage VC by charging the capacitor CT1, so that the output field effect transistor TL is conductive and the capacitor CL1 is discharged. The control circuit may comprise an extra transistor T12 which, via its conductivity channel, connects the junction 16 to the second supply terminal VSSI and is connected at its control electrode to an energization input 18 for receiving an energization signal. With a high energization signal at input 18 the transistor T12 will be conductive so that the junction 16 obtains a low voltage and cuts off the output transistor TL. With a low energization signal at input 18 the transistor T12 is cut off so that the junction 16 can be charged by the source S1 and the output transistor TL passes to the conductive state. The energization signal can also be applied to the charge source S1 (which is indicated by a broken line) so as to switch off the source S1 at a high energization signal, which results in a reduced power dissipation. The conductivity of the transistor T12 is preferably chosen to be small so as to prevent too abrupt a switching off of the output transistor TL.

Figure 2A:
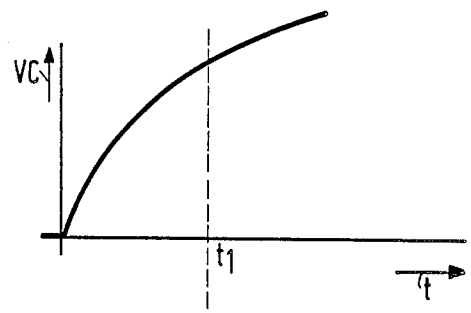
FIGS. 2a to 2d show a number of time-voltage diagrams.
Figure 2B:
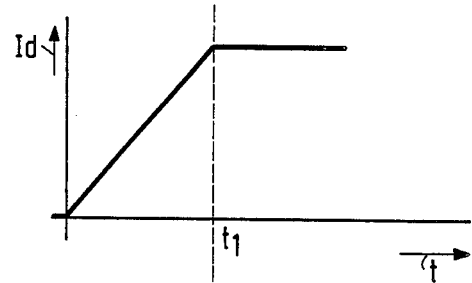
Figure 2C:
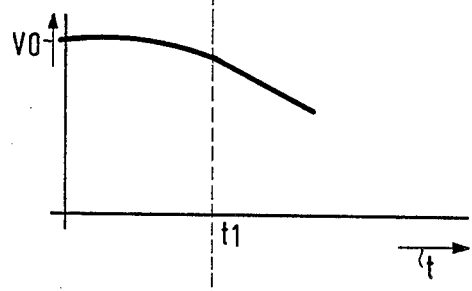
Figure 2D:
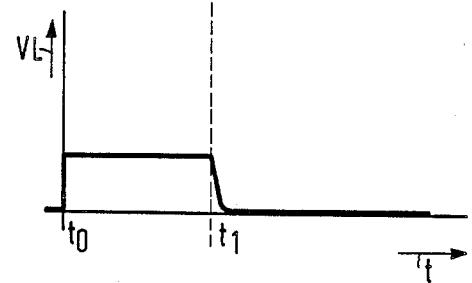

FIGS. 2a to 2d show a number of time-voltage diagrams of a switching output circuit. FIG. 2a shows the root-like increasing control voltage VC. FIG. 2b shows the discharge current Id shown in FIG. 1. FIG. 2c shows the voltage Vo at the data output 14 and FIG. 2d shows the inductive reverse voltage V1 across the connection wire L2 in FIG. 1. The time origin to of all four figures has been chosen at the instant the charge source S1 begins to charge the junction 16. With the charge increasing root-like at the junction 16 a discharge current Id through the output field effect transistor TL increases linearly since the transistor TL is saturated and the current Id through its conductivity channel is associated quadratically with the control voltage VC.

With a linear increase of the discharge current Id the capacitor CL1 will be discharged according to a quadratic characteristic. The reverse voltage VL across the connection wire L2 is proportional to the increase of the discharge current Id and will be constant since the discharge current Id increases linearly. The discharge current Id increases to its final value which is achieved at the instant t1. After the instant t1 the capacitor CL is discharged with a constant current Id, the voltage Vo at the data output decreasing linearly and the reverse voltage VL disappearing since the discharge current is substantially constant. The discharge current Id remains constant until the capacitor CL1 has been discharged to such an extent that the output transistor TL reaches its linear range. The discharge current Id will then decrease approximately via an exponential-like function (not shown in FIGS. 2a to 2d).

It will be obvious that this output circuit, starting from given values of the inductance of the connection wire L2 and a specified maximum value for the reverse voltage VL, permits obtaining the discharge of the capacitor CL1 which then is as fast as possible. Additionally, the value of the capacity CL1 proves to have no influence on the value of the reverse voltage VL. A higher value of the capacitor CL1 only results in the voltage Vo at the data output 14 decreasing more inertly.

FIG. 3 shows an equivalent circuit diagram of an output circuit of an integrated circuit according to the invention upon charging the data output 14. The components which are shown in the diagram and are identical to those of FIG. 1 are referred by the same references. The output field effect transistor TH connects the first supply terminal VDDI to the data output 14. The control electrode of the output transistor TH and a charge source S3 which is connected with its other end to the internal supply terminal VDDI are connected to the junction 36. The capacitor CT3 and transistor T32 shown have the same functions as the capacitor CT1 and transistor T21 of FIG. 1. The control electrode of transistor T32 is connected to a data input 38 which receives the inverted energization signal. Of course the inverted energization signal may be used to switch on and off the charge source S3, the energization signal switching on the charge source S3, if the inverted energization signal is low and hence the transistor T23 is cut off. The diagrams shown in FIG. 2 also apply to the diagrams shown in FIG. 3 in which it should be noted that the reverse voltage VH shown in FIG. 2d then represents the reverse voltage VH across the connection wire L1 instead of L2 and that the output voltage Vo increases naturally under the influence of the charge current Id from a low to a high voltage instead of decreasing from a high to a low voltage, as is shown in FIG. 2c.

The remarks made with reference to the first two figures also apply to the diagram shown in FIG. 3. It should be added, however, that the formation of the reverse voltage VH in FIG. 3 can also be counteracted by the negative feedback coupling of the voltage Vo at the data output 14 on the output transistor TH. However, this voltage Vo depends on the value of the capacitor CL1 and the negative feedback coupling is weaker as CL1 is larger. It is possible to direct the proportioning of the output circuit to the largest value for the capacitor CL1 falling within the specifications, but it is also very well possible in designing the integrated circuit to start from the fact that the data output 14 in practice can be loaded with an arbitrarily large capacitor CL. In the latter case the negative feedback coupling is so weak during the growth of the charge current Id that it may be neglected and the proportioning of the output circuit must be directed to a design as if the data output 14 is short-circuited with the second supply voltage VSSE.

Figure 4:
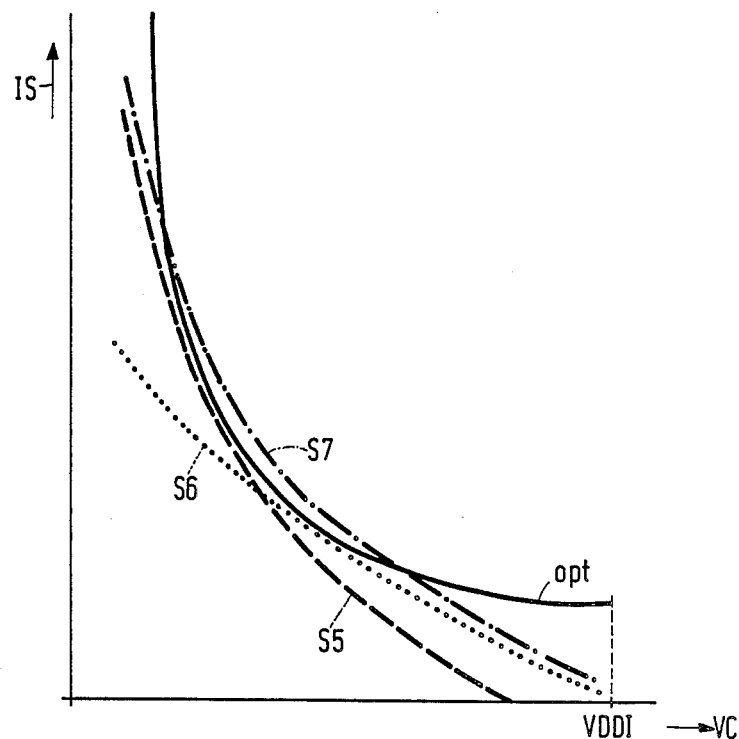
FIG. 4 shows a number of voltage-current diagrams for the charge source.

FIG. 4 shows a number of voltage-current characteristics for the charge source S.

The curve indicated by OPT denotes the theoretically optimum voltage-current curve for the charge source S in combination with the capacity CT1 or CT3. This graph is calculated by means of the following equations:

$$VL = L \frac{d(Id)}{dt}. \qquad (1)$$

with: VL the endeavored value for the inductive reverse voltage, L the inductance of the connection wire in question, Id the charge current for the output field effect transistor;

$$IS = CT \frac{d(VC)}{dt} \qquad (2)$$

with: IS the current generated by the current source S, CT the capacitive load of junction 14, VC the control voltage at junction 4; and $$Id = K(VC - Vt)^2 \qquad (3)$$

with: K a conductivity constant of the output field effect transistor. VT is the threshold voltage of the output field effect transistor.

Differentiation of equation (3) gives $$\frac{dId}{dt} = 2K (VC - Vt) \frac{d(VC)}{dt}. \qquad (4)$$

Substitution of the comparisons 1 and 2 in comparison 4 gives the following expression for the current IS supplied by the charge source S as a function of the control voltage at junction 16 or 36:

$$IS = \frac{CT \cdot VL}{2KL} \times \frac{1}{(VC - Vt)}, \qquad (5)$$

which indicates the theoretically optimum curve OPT in FIG. 4.

Figure 5:
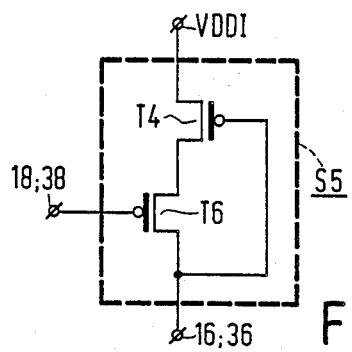
FIG. 5 shows a construction of the charge source.

The curve OPT can be approached by using the source S5 shown in FIG. 5.

The source S5 shown in FIG. 5 comprises a current branch with a series arrangement of the conductivity channels of a first and a second transistor T4 and T6 of the P conductivity type, in which the control electrode of the first transistor T4 and the conductivity channel of the second transistor T6 are connected to the internal junction 16 or 36. The conductivity channel of the first transistor T4 is connected to the first supply terminal VDDI and the control electrode of the second transistor T6 receives the energization signal at the energization input 18 or 38. The second transistor T6 serves as a switch so that the charge source S5 only generates a current IS when the output transistor is energized. The current-voltage characteristic associated with said source S5 is shown in FIG. 4 by curve S5. The approach of the curve OPT for small values of the control voltage VC may be said to be good but the current IS is essentially too low for higher values of the control voltage VC. The control voltage VC, however, will never become higher than the voltage at the first supply terminal VDDI minus the threshold voltage of the first transistor T4, so that the output field effect transistor can never receive the full voltage at the first supply terminal VDDI at its control electrode.

Figure 6:
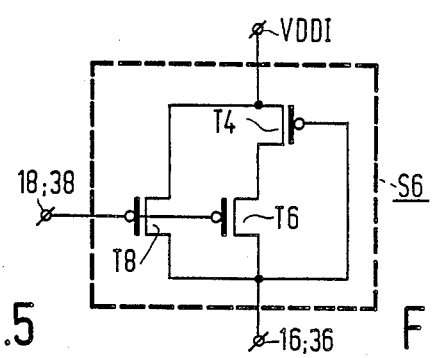
FIG. 6 shows another construction of the charge source.

The current source shown in FIG. 6 mitigates the disadvantage in that a third transistor T8 of the P conductivity type the control electrode of which is connected to the energization input 18 or 38, is connected parallel to the current branch. The voltage-current characteristic associated with said charge source S6 is indicated in the FIG. 4 graph by S6. The approach for the high values of the control voltage VC is already much better. The best approach of the curve OPT is obtained by a charge source having different parallel current branches, the current branches having mutually different switching-off voltages.

Figure 7:
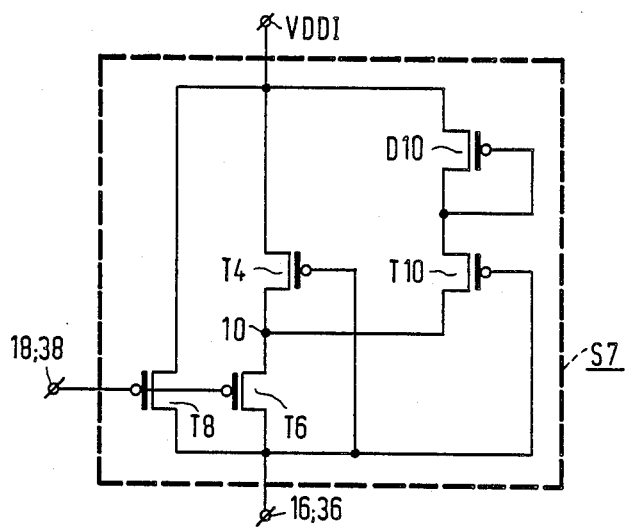
FIG. 7 shows a further construction of the charge source.

FIG. 7 shows an example of such a source S7 in which, starting from the source S6 of FIG. 6, a further second current branch has been added which comprises a series arrangement of the conductivity channels of a fourth (connected as diode) and a fifth transistor of the P conductivity type D10 and T10. The conductivity channel of the fourth transistor D10 connected as a diode in the forward direction is connected to the first supply terminal. The control electrode of the fifth transistor T10 is connected to the internal junction 16 or 36 and its conductivity channel is connected to a junction 10 between the first and the second transistor T4 and T6. The first current branch with transistor T4 has a switch-off voltage of one threshold voltage of a P type transistor, while the second current branch with the transistors T10 and T12 has a switch-off voltage of twice the threshold voltage. In this manner the source S7 for the lower control voltages VC can generate an extra current IS with the said second current branch. The curve denoted by S7 in the voltage-current characteristics of FIG. 4 then gives the best approach of the curve OPT. It will be obvious that in this manner any desired approach of the curve OPT can be obtained, in which, however, the complexity of the charge source used increases.

Figure 8:
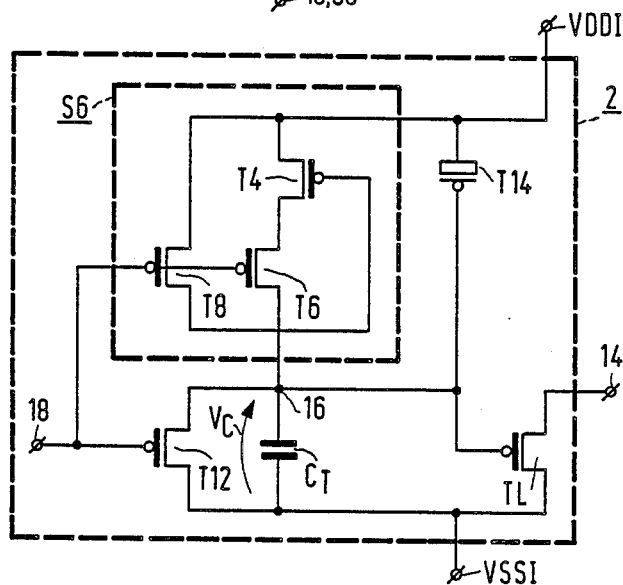
FIG. 8 shows an integrated logic circuit having a preferred form of a driving circuit.

FIG. 8 shows the integrated circuit 2 with a source S6 and an output field effect transistor T1 for discharging the data output 14. The driving circuit furthermore comprises a transistor T14 of the P conductivity type connected as a capacity which is connected with its main electrodes to the first supply terminal VDDI and with its control electrode to the internal junction 16. The charge sources S5, S6 and S7 the characteristics of which are shown in FIG. 4 generate too low a current IS when the control voltage VC approaches the voltage at the first supply terminal VDDI. This undesired effect can be compensated for by the transistor T14 since its capacity decreases strongly when the control voltage VC becomes higher than a threshold voltage below the voltage at the first supply terminal VDDI. The capacitive load of the junction 16 hence decreases, as a result of which the "root-like" charging of the junction 16 can be done in spite of the lower current IS.

It will be apparent that the invention can also be applied to output field effect transistors of the P channel type in which the transistors in the charge source S and the transistor T14 connected as a capacity should be of the N-type, in which they have to be connected to the second supply terminal VSSI. The transistor T12 or T32 must then be chosen to be of the P-conductivity type and should connect the junction 16 or 36 to the first supply terminal VDDI. From this it appears that the output circuit may comprise both only output field effect transistors of the P type or the N type and a combination thereof, as is usual in CMOS circuits.

What is claimed is:

1. An integrated logic circuit comprising a first and a second supply terminal for receiving a supply voltage, an output insulated gate field effect transistor and at least one data output having an output circuit in which the conductivity channel of said output insulated gate field effect transistor connects said data output to one of said two supply terminals, the output circuit further comprising a control circuit for generating a time-dependent control voltage at the control electrode of said output insulated gate field effect transistor, characterized in that said control circuit, at least during an initial period after switching on, generates a control voltage which varies at least approximately proportionally to the square root of time.

2. An integrated logic circuit as claimed in claim 1, characterized in that said control circuit comprises a capacitive load which is connected between the control electrode of said output insulated gate field effect transistor and one of said two terminals, and a charge source which is connected between said control electrode of said output insulated gate field effect transistor and one of said two supply terminals.

3. An integrated logic circuit as claimed in claim 2, further comprising first and second insulated gate field effect transistors, characterized in that said charge source comprises a current branch having a series arrangement of the conductivity channels of said first and second insulated gate field effect transistors, the control electrode of said first insulated gate field effect transistor and conductivity channel of said second insulated gate field effect transistors being connected to the control electrode of said output insulated gate field effect transistor and the conductivity channel of said first insulated gate field effect transistor being connected to one of the two supply terminals, the control electrode of said second insulating gate field effect transistor being connected to an energization input for receiving an energization signal for said output insulated gate field effect transistor.

4. An integrated logic circuit as claimed in claim 3, characterized in that the charge source comprises a third insulated gate field effect transistor, the control electrode of which is connected to the energization input and the conductivity channel of which is connected in parallel with the series arrangement of the first and the second insulated gate field effect transistors.

5. An integrated logic circuit as claimed in claim 3 or 4, characterized in that the charge source comprises several parallel-arranged current branches which have mutually different switch-off voltages.

6. An integrated logic circuit as claimed in claim 3 or 4, characterized in that said output insulated gate field effect transistor is of the N type and said insulated gate field effect transistors in the charge source are of the P type, said charge source being connected to the supply terminal for receiving the higher of the two supply voltages.

7. An integrated logic circuit as claimed in claim 6, characterized in that said capacitive load comprises a P channel insulated gate field effect transistor, the main electrodes of which are connected to the supply terminal for receiving the higher of the two supply voltages and the control electrode of which is connected to the control electrode of said output insulated gate field effect transistor.

8. An integrated logic circuit as claimed in claim 3 or 4, characterized in that said output insulated gate field effect transistor is of the P type and said insulated gate field effect transistors in the charge source are of the N type, said charge source being connected to the supply terminal for receiving the lower of the two supply voltages.

9. An integrated logic circuit as claimed in claim 8, characterized in that said capacitive load comprises an N channel insulated gate field effect transistor, the main electrodes of which are connected to the supply terminal for receiving the lower of the two supply voltages and the control electrode of which is connected to the control electrode of the output field effect transistor.

* * * * *